(12) United States Patent
Haeberlen et al.

(10) Patent No.: US 11,004,966 B2
(45) Date of Patent: May 11, 2021

(54) NITRIDE SEMICONDUCTOR DEVICE

(71) Applicant: Infineon Technologies Austria AG, Villach (AT)

(72) Inventors: Oliver Haeberlen, Villach (AT); Walter Rieger, Arnoldstein (AT)

(73) Assignee: Infineon Technologies Austria AG, Villach (AT)

( * ) Notice: Subject to any disclaimer, the term of this patent is extended or adjusted under 35 U.S.C. 154(b) by 46 days.

(21) Appl. No.: 14/708,736

(22) Filed: May 11, 2015

(65) Prior Publication Data

US 2015/0243775 A1 Aug. 27, 2015

Related U.S. Application Data

(62) Division of application No. 12/713,336, filed on Feb. 26, 2010, now abandoned.

(51) Int. Cl.
*H01L 29/66* (2006.01)
*H01L 29/778* (2006.01)
(Continued)

(52) U.S. Cl.
CPC ...... *H01L 29/7787* (2013.01); *H01L 27/0605* (2013.01); *H01L 27/085* (2013.01);
(Continued)

(58) Field of Classification Search
CPC .............. H01L 27/0605; H01L 27/085; H01L 29/1066; H01L 29/2003; H01L 29/201; H01L 29/205; H01L 29/41766; H01L 29/42316; H01L 29/432; H01L 29/66462; H01L 29/7786; H01L 29/7787
See application file for complete search history.

(56) References Cited

U.S. PATENT DOCUMENTS 7,271,429 B2 9/2007 Saito et al.
7,576,373 B1 8/2009 Hikita et al.
(Continued)

FOREIGN PATENT DOCUMENTS

JP 2005-244072 9/2005
JP 2008211172 9/2008
(Continued)

OTHER PUBLICATIONS

"A Normally-off AlGaN/GaN Transistor with RonA=2.6mΩcm2 and BVds=640V Using Conductivity Modulation" Yasuhiro Uemoto, et al., IEEE 2006 (4 pgs.).
(Continued)

*Primary Examiner* — Meiya Li
(74) *Attorney, Agent, or Firm* — Dicke, Billig & Czaja, PLLC

(57) ABSTRACT

A semiconductor device is described. In one embodiment, the device includes a Group-III nitride channel layer and a Group-III nitride barrier layer on the Group-III nitride channel layer, wherein the Group-III nitride barrier layer includes a first portion and a second portion, the first portion having a thickness less than the second portion. A p-doped Group-III nitride gate layer section is arranged at least on the first portion of the Group-III nitride barrier layer and a gate contact formed on the p-doped Group-III nitride gate layer.

20 Claims, 11 Drawing Sheets

(51) Int. Cl.
  *H01L 29/20*    (2006.01)
  *H01L 29/423*   (2006.01)
  *H01L 27/085*   (2006.01)
  *H01L 27/06*    (2006.01)
  *H01L 29/201*   (2006.01)
  *H01L 29/205*   (2006.01)
  *H01L 29/417*   (2006.01)
  *H01L 29/10*    (2006.01)
  *H01L 29/43*    (2006.01)

(52) U.S. Cl.
  CPC ........ *H01L 29/201* (2013.01); *H01L 29/2003* (2013.01); *H01L 29/205* (2013.01); *H01L 29/42316* (2013.01); *H01L 29/66462* (2013.01); *H01L 29/7786* (2013.01); *H01L 29/1066* (2013.01); *H01L 29/41766* (2013.01); *H01L 29/432* (2013.01)

(56) References Cited

U.S. PATENT DOCUMENTS

| | | | |
|---|---|---|---|
| 2002/0066908 A1 | 6/2002 | Smith | |
| 2005/0189559 A1 | 9/2005 | Saito et al. | |
| 2006/0060871 A1* | 3/2006 | Beach | H01L 29/0623 257/94 |
| 2006/0273347 A1 | 12/2006 | Hikita et al. | |
| 2006/0281238 A1 | 12/2006 | Harris et al. | |
| 2008/0179694 A1 | 7/2008 | Nakazawa et al. | |
| 2009/0072272 A1* | 3/2009 | Suh | H01L 29/1066 257/194 |
| 2009/0146182 A1* | 6/2009 | Hikita | H01L 29/2003 257/190 |
| 2009/0212325 A1 | 8/2009 | Sato | |
| 2011/0227093 A1 | 9/2011 | Hikita et al. | |
| 2011/0266554 A1 | 11/2011 | Hikita et al. | |

FOREIGN PATENT DOCUMENTS

| | | |
|---|---|---|
| JP | 2008244324 | 10/2008 |
| JP | 2009-10216 | 1/2009 |
| JP | 2009-099691 | 5/2009 |
| JP | 2009141244 | 6/2009 |
| JP | 2009-200395 | 9/2009 |
| JP | 2008-91394 | 10/2009 |
| JP | 2010135641 | 6/2010 |
| JP | 2010-225765 | 10/2010 |

OTHER PUBLICATIONS

"Enhancement Mode AlGGaN/GaN HFET with selectively Grown pn junction gate", Hu, et al., Electronics Letters, 13.04.00, vol. 36, pp. 753-754, Apr. 13, 2000 (2 pgs.).

Notice of Rejection dated Jun. 18, 2013 relative to JP 2011-036493.

* cited by examiner

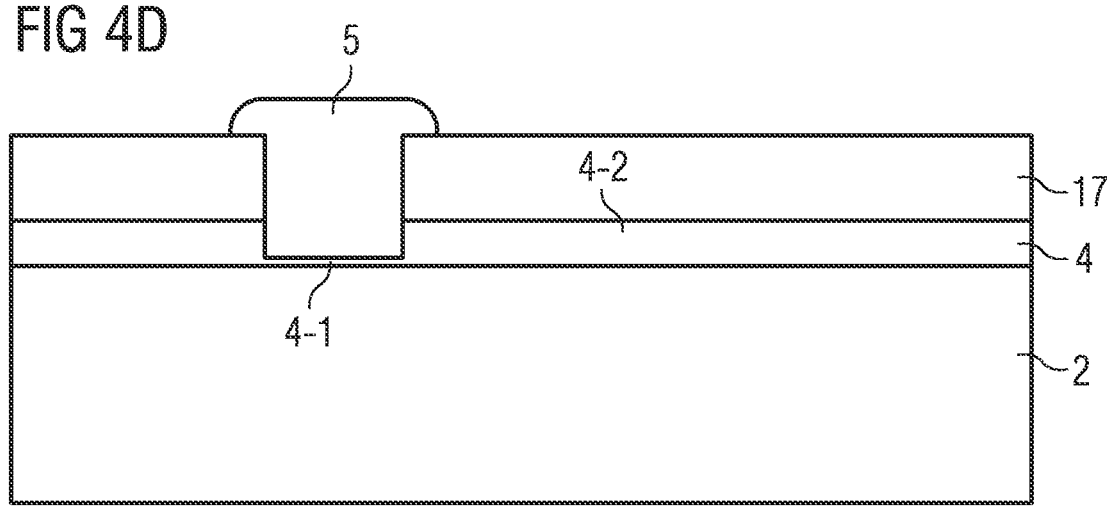
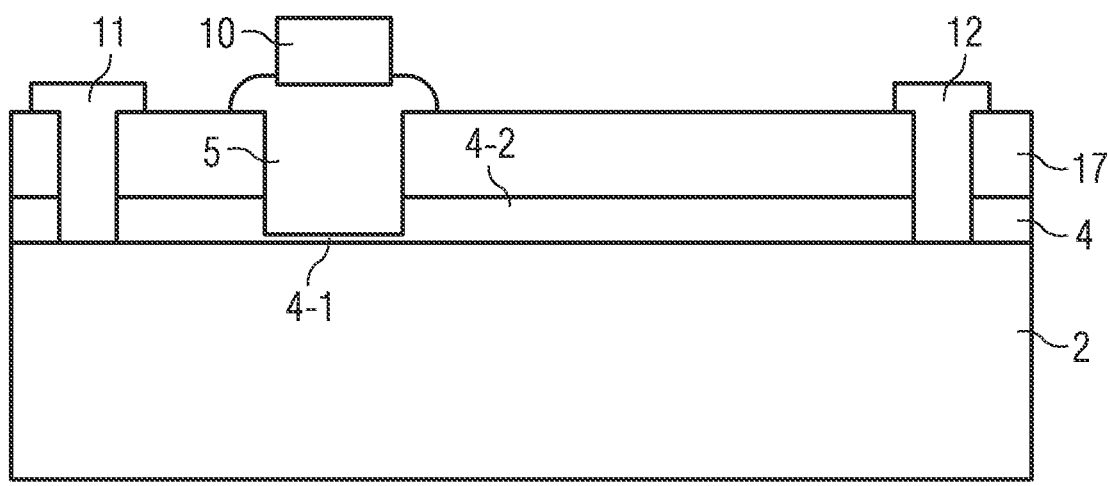

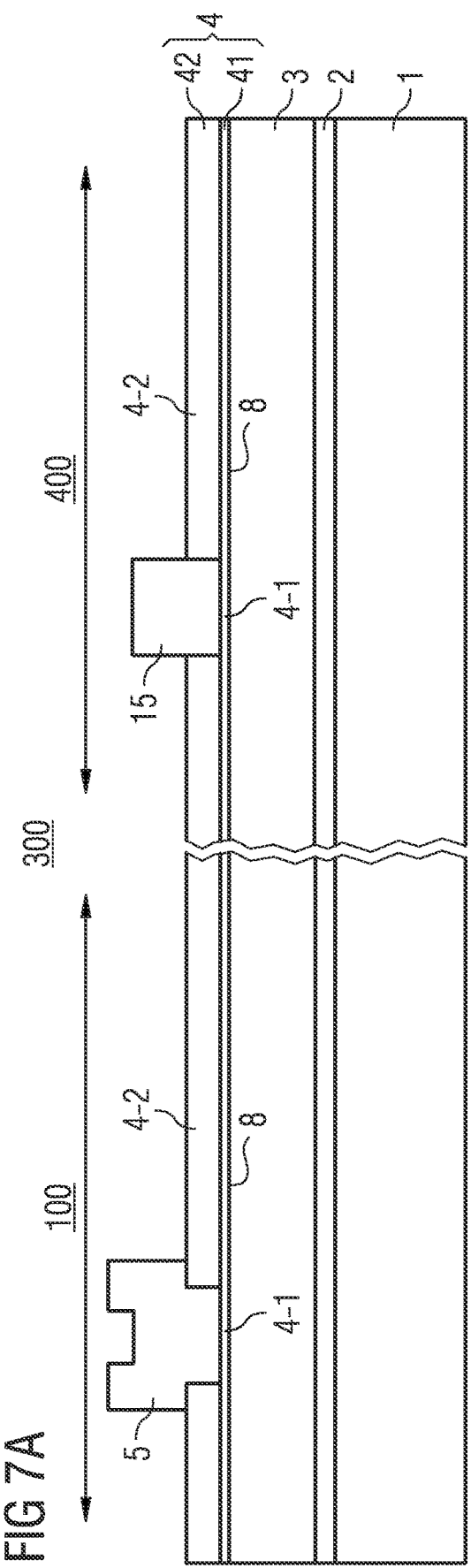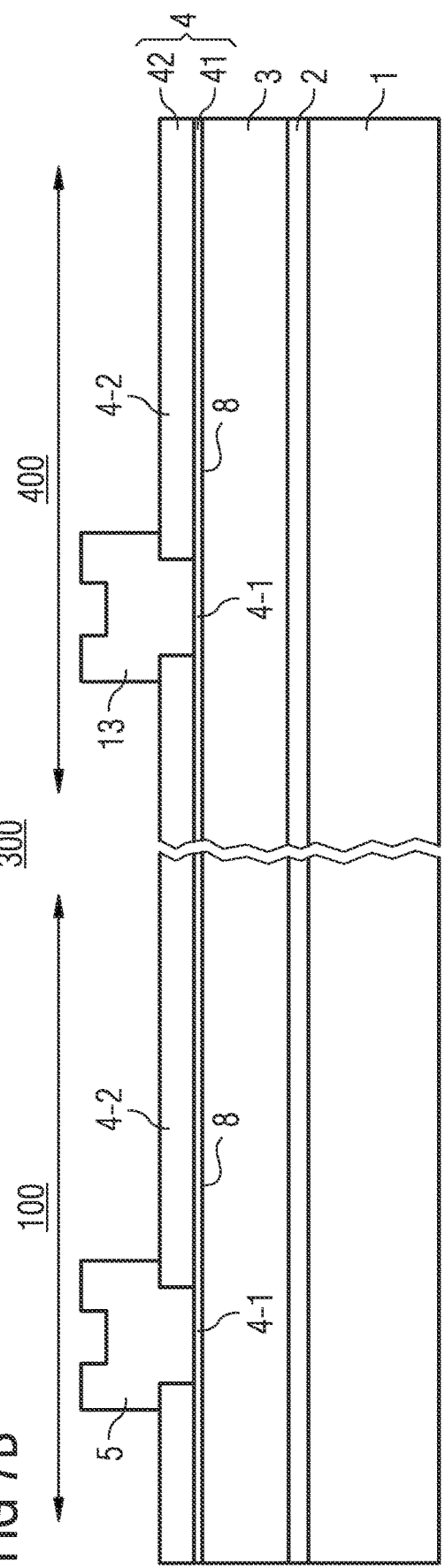

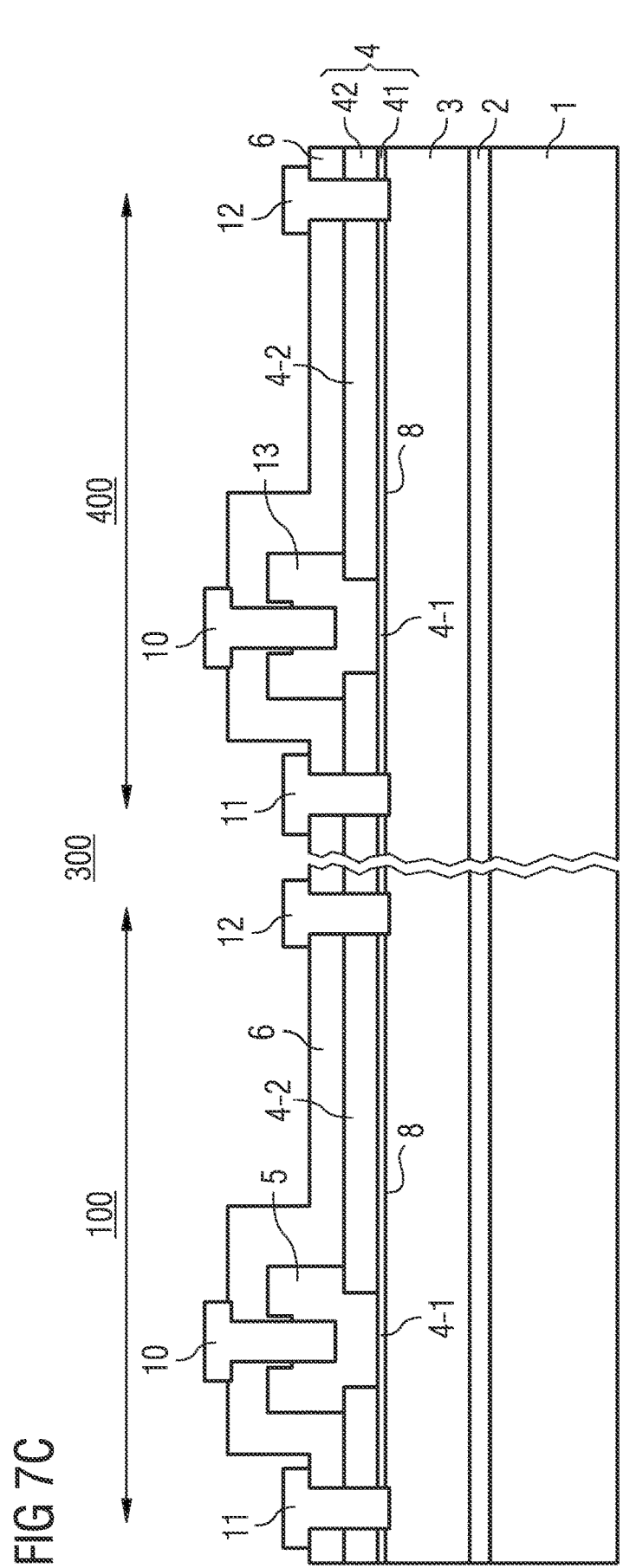

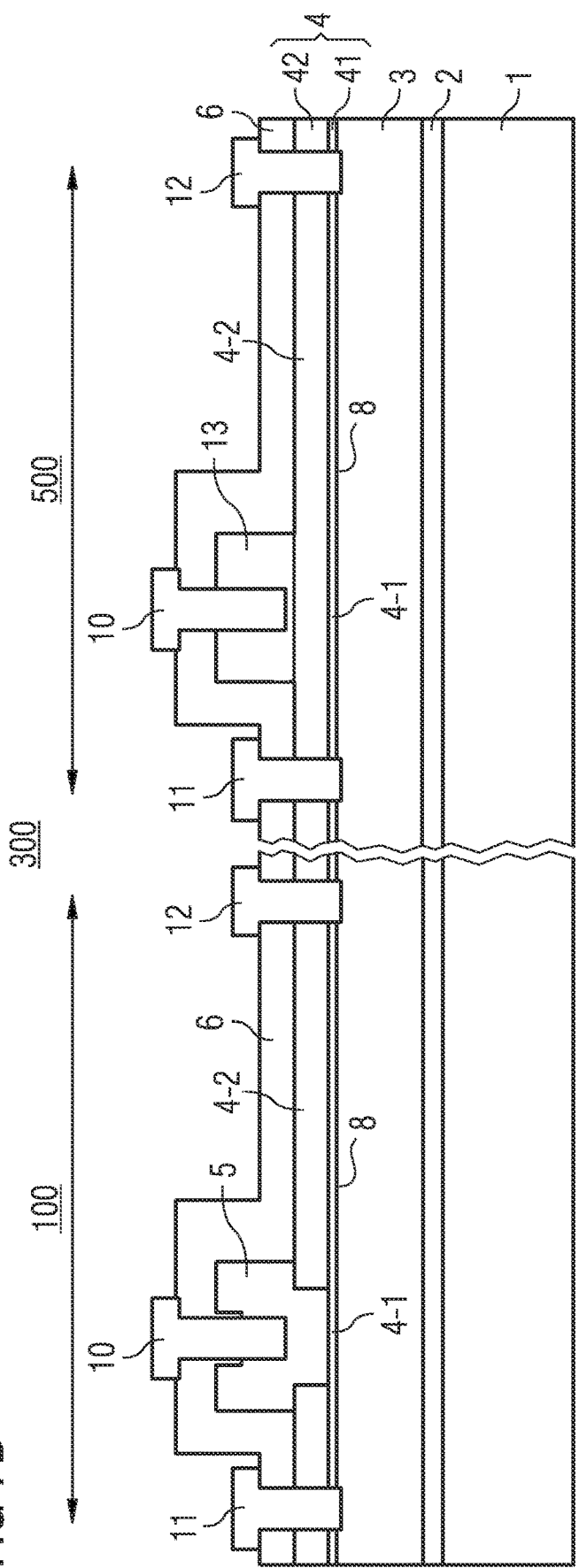

NITRIDE SEMICONDUCTOR DEVICE

This Utility Patent Application is a divisional application of U.S. application Ser. No. 12/713,336, filed Feb. 26, 2010, which is incorporated herein by reference.

This description refers to embodiments of nitride semiconductor devices and particularly high electron mobility transistors (HEMTs) and methods for manufacturing such devices. The description also refers to power nitride semiconductor devices such as power-HEMTs.

BACKGROUND

Common power devices on the basis of GaN (gallium nitride) are mainly lateral HEMTs using a 2-dimensional electron gas (2-DEG) which is formed at the heterojunction between undoped GaN and undoped AlGaN (aluminium gallium nitride). Such devices are typically normally-on devices.

Approaches to form normally-off-devices, i.e. enhancement devices, include a p-doped AlGaN or p-doped GaN barrier layer between the gate and the undoped barrier layer to raise the conductivity band of the barrier layer such that the threshold voltage of the device is shifted to positive values. In order to obtain functional devices, the undoped barrier layer should not produce a too high density of the 2-dimensional electron gas, which counteracts the threshold voltage rise. However, reducing the density of the 2-DEG also reduces the conductivity of the drift region between source and drain.

Another approach is to form a recessed-gate-structure with a reduced barrier thickness below the gate formed by a Schottky metal. Manufacturing of such structures is complicated and not always reproducible.

For these and other reasons there is a need for the present invention.

BRIEF SUMMARY

According to an embodiment, a nitride semiconductor device is provided. The nitride semiconductor device includes a Group-III nitride channel layer; a Group-III nitride barrier layer on the Group-III nitride channel layer, the Group-III nitride barrier layer including a first portion and a second portion, the first portion having a thickness less than the second portion; a p-doped Group-III nitride gate layer section arranged at least on the first portion of the Group-III nitride barrier layer; and a gate contact on the p-doped Group-III nitride gate layer.

BRIEF DESCRIPTION OF THE SEVERAL VIEWS OF THE DRAWINGS

A full and enabling disclosure, including the best mode thereof, to one of ordinary skill in the art, is set forth more particularly in the remainder of the specification, including reference to the accompanying figures.

FIGS. 4A to 4E illustrate processes of a method for manufacturing a nitride semiconductor device such as a HEMT according to an embodiment.

FIGS. 7A to 7D illustrate processes of a method for manufacturing a nitride semiconductor device including a depletion and an enhancement nitride semiconductor device such as a depletion and an enhancement HEMT according to an embodiment.

DETAILED DESCRIPTION

Reference will now be made in detail to various embodiments, one or more examples of which are illustrated in the figures. Each example is provided by way of explanation, and is not meant as a limitation of the appending claims. For example, features illustrated or described as part of one embodiment can be used on or in conjunction with other embodiments to yield yet a further embodiment. It is intended that the present description includes such modifications and variations. The examples are described using specific language, which should not be construed as limiting the scope of the appending claims. The drawings are not scaled and are for illustrative purposes only.

The term "lateral" as used in this specification intends to describe an orientation parallel to the main surface of a semiconductor substrate.

The term "vertical" as used in this specification intends to describe an orientation, which is arranged perpendicular to the main surface of the semiconductor substrate.

In this specification, a second surface of a semiconductor substrate is considered to be formed by the lower or backside surface while a first surface is considered to be formed by the upper, front or main surface of the semiconductor substrate. The terms "above" and "below" as used in this specification therefore describe a relative location of a structural feature to another structural feature with consideration of this orientation.

Specific embodiments described in this specification pertain to, without being limited thereto, power semiconductor devices and particularly to devices which are controlled by field-effect such as high electron mobility transistor (HEMTs) using a 2-dimensional electron gas (2-DEG). Such devices are also described as heterojunction field effect transistors (HFETs).

Figure 1:
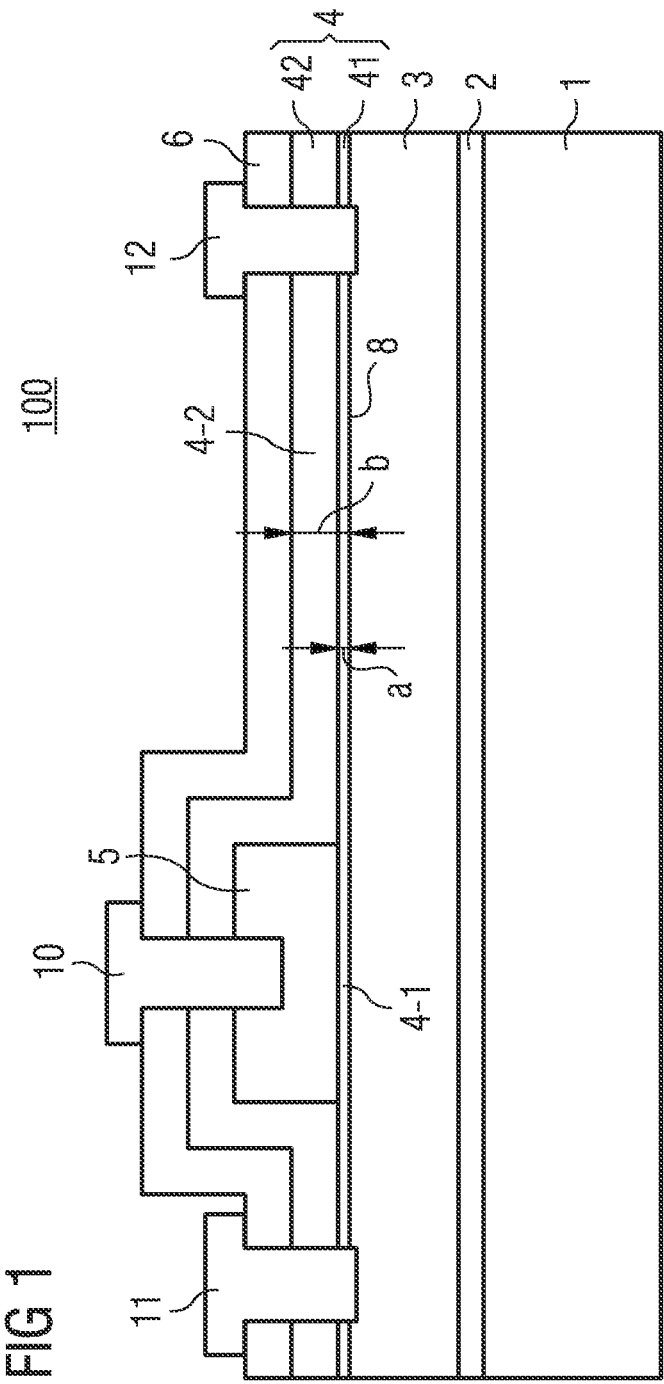
FIG. 1 illustrates a nitride semiconductor device embodied as a HEMT according to one embodiment.

With reference to FIG. 1, a first embodiment of a nitride semiconductor device such as a HEMT is described. In the following description, the nitride semiconductor device will be referred to as HEMT without being limited thereto. As it will become apparent from the further description, the HEMT 100 includes a barrier layer, which is thinner below the gate of the HEMT 100 in comparison to the barrier layer in the gate-drain and gate-source section.

According to an embodiment, a nitride semiconductor device is provided. The nitride semiconductor device includes a Group-III nitride channel layer; a Group-III nitride barrier layer on the Group-III nitride channel layer, the Group-III nitride barrier layer including a first portion and a second portion, the first portion having a thickness less than the second portion; a p-doped Group-III nitride gate layer section arranged at least on the first portion of the Group-III nitride barrier layer; and a gate contact on the p-doped Group-III nitride gate layer.

According to another embodiment, a method for manufacturing a nitride semiconductor device is provided. The method includes providing a Group-III nitride channel layer; forming a Group-III nitride barrier layer having a first portion and a second portion on the Group-III nitride channel layer, the first portion having a thickness less than the second portion; forming a p-doped Group-III nitride gate layer section at least on the first portion of the Group-III nitride barrier layer; forming a gate contact on the p-doped Group-III nitride gate layer; forming a source electrode; forming a drain electrode spaced apart from the source electrode.

Further embodiments, modifications and improvements of the semiconductor device and the method will become more apparent from the following description and the appending claims.

The HEMT 100 includes a semiconductor substrate 1, which can be made of different materials such as GaN (gallium nitride), Si (silicon), SiC (silicon carbide) or $Al_2O_3$ (sapphire). Examples for SiC substrates are 4H, 3C, 6H and 15 R polytypes of SiC. SiC has a for example a higher thermal conductivity than sapphire which facilitates thermal dissipation of the device.

The HEMT 100 can be manufactured using different materials. According to one or more embodiments described herein, the material system used for fabricating the HEMT 100 is based on Group-III nitride semiconductor materials. Group-III refers to semiconductor compounds, which are formed between nitrogen and one or more elements from the Group III of the periodic system, typically Al (aluminium), Ga (gallium), and In (indium). Group-III nitride semiconductor materials refer to binary materials such as GaN and InN, ternary materials such as AlGaN and AlInN, and quarternary materials such as AlGaInN. These materials exhibit a high spontaneous piezoelectric polarization, which is very useful for generating a 2-DEG.

As there might be a lattice mismatch between the substrate 1 and the Group-III material, an optional buffer layer 2 can be provided on the substrate 1. Different materials can be used for the buffer layer 2. According to one or more embodiments, a suitable material for the buffer layer 2 can be $Al_wGa_{1-w}N$ (0≤w≤1). MN ($Al_wGa_{1-w}N$ for w=1) is typically used, for example, in the embodiment illustrated in FIG. 1. According to one or more embodiments, a multi layer buffer layer formed by alternating combinations of semiconductor nitride layers can also be used. The buffer layer 2 can have a sufficient thickness to provide for lattice compensation.

The HEMT 100 also includes Group-III nitride layer 3, which forms a channel layer. In the following description, the Group-III nitride layer 3 is referred to as channel layer. The channel layer 3 can generally be made of $Al_aGa_{1-a}N$ with 0≤a≤1 and is typically significantly thicker than the buffer layer 2. Channel layer 3 can also be thinner than buffer layer 2, or can be of same thickness. According to one or more embodiments, the channel layer 3 is made of GaN ($Al_aGa_{1-a}N$ for a=0). The channel layer 3 is typically undoped. In connection with this specification, undoped means not intentionally doped. A skilled person will appreciate that semiconductor materials are not completely undoped and might include traces of impurities.

In one embodiment, the channel layer 3 is thicker than the buffer layer 2 and can be in the range from about 2 μm to 6 μm although other thicknesses can also be used. The channel layer 3 is arranged on the optional buffer layer 2 opposite to the substrate 1. When no buffer layer 2 is used, channel layer 3 will be arranged directly on the substrate 1, for example, when a Group-III nitride substrate 1 is used.

A Group-III nitride barrier layer 4, which is referred to in the following as barrier layer, is included on the channel layer 3 opposite to the optional buffer layer 2 and substrate 1. According to one or more embodiments, the barrier layer 4 can be made of a material selected from the group including $Al_bGa_{1-b}N$ (0≤b≤1) and $Al_cIn_{1-c}N$ (0≤c≤1 and a<c). According to one or more embodiments, the content of aluminium in the barrier layer 4 is higher than the content of aluminium in the channel layer 3, i.e. a<b and a<c. An example is $Al_{0.3}Ga_{0.7}N$ for the barrier layer 4 and GaN for the channel layer 3. The barrier layer 4 can be a single layer or a composition including two, three or more layers. For example, the barrier layer 4 can be composed of several monolayers. In one or more embodiments, the barrier layer 4 is undoped.

According to one or more embodiments, the barrier layer 4 can be composed of at least a first Group-III nitride barrier layer 41, which will be referred to in the following as first barrier layer, and at least a second Group-III nitride barrier layer 42, which will be referred to in the following as second barrier layer. The first barrier layer 41 can be made of $Al_{b1}Ga_{1-b1}N$ (0≤b1≤1) or $Al_{c1}In_{1-c1}N$ (0≤c1<1) with typically a<b1 and a<c1, i.e. the Al-content in the first barrier layer 41 is higher in one or more embodiments than in the channel layer 3. The second barrier layer 42 can be made of $Al_{b2}Ga_{1-b2}N$ (0≤b2≤1) or $Al_{c2}In_{1-c2}N$ (0≤c2≤1) with typically a<b2 and a<c2, i.e. the Al-content in the second barrier layer 42 is higher in one or more embodiments than in the channel layer 3. First and second barrier layers 41, 42 are typically undoped.

First barrier layer 41 is comparably thin, for example equal to or less than 5 nm, for example 1 nm to 2 nm thick. Second barrier layer 42 can be of the same thickness, for example equal to or less than 5 nm, but can also be thicker than first barrier layer 41, for example about 20 nm. First and second barrier layers 41 and 42 can also have other thicknesses and other thickness relations. For example, both barrier layers 41, 42 can have substantially the same thickness such as about 5 nm.

The region, where the first barrier layer 41 is covered by a gate layer section 5 described below is also referred to as first portion 4-1 of the barrier 4, while the region, where both the first and second barrier layers 41, 42 are in contact with each other, are referred to as second portion 4-2 of the barrier layer 4. First portion 4-1 forms the gate region while second portion 4-2 forms a gate-source section and a gate-drain section, respectively. According to one or more embodiments, first portion 4-1 of the barrier layer 4 has a thickness less than the thickness of the second portion 4-2.

FIG. 1 illustrates thickness relations between the first barrier layer 41 and the barrier layer 4 composed of first and second barrier layers 41, 42. First barrier layer 41 (first portion 4-1 of the barrier layer 4) has a thickness "a" while the thickness of the barrier layer 4 outside of the gate region (second portion 4-2 of the barrier layer 4) is "b". In one or more embodiments, the thickness relation a:b can be in a range from about 1:2 to about 1:10.

In one embodiment the barrier layer 4 is formed on and in contact with the channel layer 3 to form a heterojunction interface. In one embodiment, the material of the barrier layer 4 has a higher bandgap width than the material of the channel layer 3. The difference in the band gap width can be adjusted, for example, by selecting the Al-content in the respective layers. When the barrier layer 4 includes at least the first and the second barrier layers 41, 42, first barrier layer 41 is typically arranged on and in contact with the channel layer 3 so that the heterojunction interface is formed between the channel layer 3 and the first barrier layer 41.

At the heterojunction interface between the channel layer 3 and the barrier layer 4 or between the channel layer and the first barrier layer 41, respectively, a 2-DEG layer 8 is formed as a result of the piezoelectric polarization, lattice mismatch and difference of the band gap widths of the channel layer 3 and the barrier layer 4 or first barrier layer 41. In one embodiment, the barrier layer 4 and first and second barrier layers 41, 42 have a larger band gap than the channel layer 3. The 2-DEG layer 8 forms a conductive channel connecting a source electrode 11 with a drain electrode 12. Without additional measures, the HEMT 100 forms a depletion mode device (normally-on) since the 2-DEG layer 8 provides a conductive channel between source 11 and drain 12.

The HEMT 100 further includes a passivation layer 6 and a gate contact 10.

To obtain an enhancement mode device (normally-off), a p-doped Group-III nitride gate layer section 5, which will be referred to in the following as gate layer section 5, is arranged on the barrier layer 4. Gate layer section 5 can be made of p-doped $Al_zGa_{1-z}N$ with $0 \le z \le 1$, for example GaN ($Al_zGa_{1-z}N$ for $z=0$). Gate layer section 5 reduces the electron population in the 2-DEG layer 8 under the gate region (first portion 4-1) of the barrier layer 4, which brings about a shift of the threshold voltage of about 3 V in positive direction in comparison to a device that does not include a p-doped gate layer section. As the 3 V roughly corresponds to the band gap of the barrier layer 4, the formation of the 2-DEG is restricted or prevented in the gate region so that the device is normally-off.

The p-doped gate layer section 5 can have a thickness of about 100 nm although other thicknesses can be used as well. The doping concentration of the p-doped gate layer section 5 is typically about $10^{18}$ cm$^{-3}$ although other doping concentrations can be used as well. The p-doping concentration can be increased towards the upper surface of the gate layer section 5 to provide a low ohmic p-contact to a gate metal. In one embodiment, an additional highly p-doped Group-III nitride capping layer can be deposited on gate layer section 5. Furthermore, gate layer section 5 can include several p-doped Group-III nitride layers of different doping concentration and different composition if desired. Examples for the material used as p-doped gate layer section 5 are GaN and $Al_{0.2}Ga_{0.8}N$.

In one embodiment, the gate layer section 5 is formed in the gate region on and in contact with the barrier layer 4 or, in case of the first and second barrier layers 41, 42, on and in contact with the first barrier layer 41. The second barrier layer 42 can then be formed on and in contact with the first barrier layer 41 in regions, which are not covered by the gate layer section 5.

Figure 5:
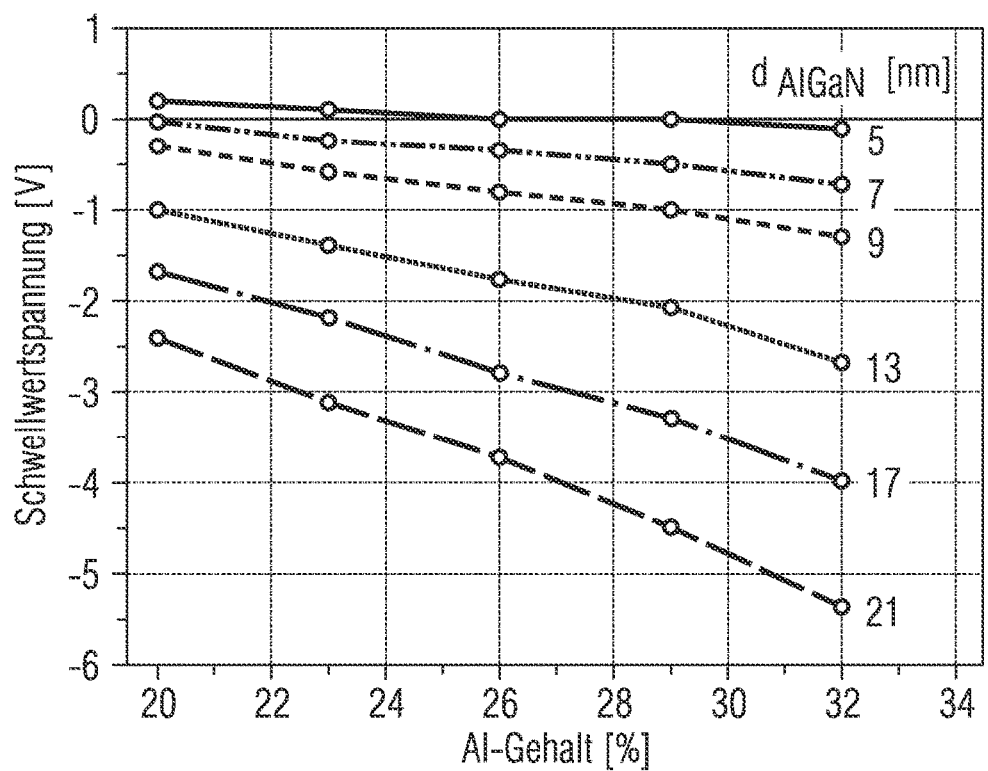
FIG. 5 illustrates the relationship between threshold voltage, Al-content in the barrier layer and thickness of the barrier layer.

The selection of the material used for channel layer 3 and barrier layer 4 also influences the extent to which the 2-DEG layer 8 is formed at the heterojunction between the channel layer 3 and barrier layer 4. For example, the Al-content in the barrier layer 4, or more generally, the difference of the Al-content between the channel layer 3 and barrier layer 4, has an impact on the threshold voltage of the device. Another parameter, which should be considered, is the thickness of the barrier layer 4. FIG. 5 illustrates the relation between the thickness of the barrier layer 4 in the gate region between the gate layer section 5, the Al-content of the barrier layer 4 below the gate layer section 5, and the threshold voltage. To obtain a threshold voltage larger than −1 V, i.e. a more positive value, a comparably high Al-content can be used when the barrier layer 4 between the gate layer section 5 and the channel layer 3 is made thin. For example, the barrier layer 4, or the first barrier layer 41, can have a thickness of up to 9 nm when their Al-content does not exceed about 30% to 35%. By further reducing the thickness of the barrier layer 4 between the p-doped gate layer section 5 and the channel layer 3, an even higher Al-content can be used. The thickness and the Al-content of the barrier layer 4 below the p-doped gate layer section 5 or the thickness of the first barrier layer 41 is typically selected such to obtain a threshold shift, caused by the barrier layer, i.e. without the p-doped gate layer section 5, of not more than −1V.

The undoped barrier layer 4 shifts the threshold voltage to negative values by increasing the density of the electron gas in the 2-DEG layer 8. A high density of the electron gas in the gate-drain and gate-source section is desired. Contrary thereto, p-doped gate layer section 5 shifts the threshold voltage in the gate region to positive values. The combination of these two opposing effects defines the threshold voltage of the HEMT.

According to one or more embodiments, the Al-content of the first barrier layer 41 can be different to the Al-content of the second barrier layer 42 although both the first and second barrier layers 41, 42 can also have the same Al-content. In one embodiment, the first barrier layer 41 has a higher Al-content than the second barrier layer 42. In one or more embodiments, the Al-content of the first barrier layer 41 can be different to the Al-content of the p-doped gate layer section 5. Using a different Al-content in the first and second barrier layers 41, 42 allows a higher freedom in tailoring the electrical properties of the HEMT 100. This allows, for example, adjustment of the threshold voltage of the device, which is defined by the opposing action of the p-doped gate layer section 5 and the first barrier layer 41, independent of the adjustment of the resistance of the gate-drain section and gate-source section of the 2-DEG layer 8, respectively. Hence, it is possible to provide the gate-drain section (GD section) and gate-source section (GS section) with a low resistance while keeping the threshold voltage at a desired level. To reduce the on-resistance of the HEMT 100, the first barrier layer 41 can be made thin and of, for example, AlN ($Al_{b1}Ga_{1-b1}N$ for $b1=1$) while the second barrier layer 42 can be made of $Al_{0.3}Ga_{0.7}N$ ($Al_{b2}Ga_{1-b2}N$ for $b2=0.3$). It is also possible to use the same material for the first and second barrier layers 41, 42 since the smaller different thickness of the first barrier layer 41 (first portion 4-1; gate region) alone in comparison to the larger thickness of the combined first and second barrier layers 41, 42 (second portion 4-2; gate-drain section and gate-source section) also brings about a different density of the electron gas in the 2-DEG layer 8.

Using a different Al-content for the first and second barrier layers 41, 42 also facilitates the manufacturing process. For example, by adjusting the Al-content of the first layer 41 relative to the Al-content of the p-doped gate layer section 5, a selective etching of the material of the gate layer section 5 relative to the first barrier layer 41 is possible so that the first barrier layer 41 functions as etch stop.

Another improvement is that the thickness of the barrier layer 4, composed of the first and second barrier layers 41, 42, can be finely adjusted in the region between gate layer section 5 and the channel layer 3 (gate region) since the thickness of the barrier layer 4 in that region also influences the threshold voltage. For example, variations of about 1 nm of the thickness in that region may cause observable variations of the threshold voltage. Since the first barrier layer 41 can be separately formed, typically by epitaxial deposition, which can be finely controlled, the thickness of the barrier layer 4 between the p-doped gate layer section 5 and the channel layer 3 can be finely adjusted. Furthermore, variations of the thickness between devices commonly process can by reduced which improves the yield.

The barrier layer 4 can also include further layers if desired. Basically, the barrier layer 4 can include several layers of different or same material. Furthermore, the first barrier layer 41 can include more than one layer of different or same material. Moreover, the second barrier layer 42 can include more than one layer, such as two or three layers of same or different material. Using more layers provides more freedom for tailoring the electrical characteristics of the device. Barrier layer 4, or second barrier layer 42, can additionally be covered by a thin, e.g., 2 nm, layer of GaN to reduce the oxidation susceptibility of the barrier layer.

According to one or more embodiments, the HEMT 100 includes a barrier layer 4 having a recess. The term "recess" is to be understood as a region where the barrier layer 4 has a portion with a smaller thickness than adjacent regions. The recess is defined by the first portion 4-1 of the barrier layer 4 having a thickness less than the second portion 4-2 of the barrier layer 4. The recess can be formed by a partial etching of the barrier layer 4 and also be a build-up using two or more barrier layers. The p-doped gate layer section 5 is formed at least in the recess, for example on and in contact with the first portion 4-1 of the barrier layer 4. According to one or more embodiments, the barrier layer 4 includes a first barrier layer 41 and a second barrier 42 formed on and in contact with the first barrier layer 41. The second barrier layer 42 includes an opening extending to the first barrier layer 41 to define a recess (gate portion) of the barrier layer 4. The p-doped gate layer section 5 is arranged in the opening of the second barrier layer 42 and on and in contact with the first barrier layer 41.

According to one or more embodiments, nitride semiconductor device is provided which includes a Group-III nitride channel layer and a Group-III nitride barrier layer on the Group-III nitride channel layer, wherein the Group-III nitride barrier layer includes a recess. A p-doped Group-III nitride gate layer section is arranged at least in the recess of the Group-III nitride barrier layer. A gate contact is arranged on the p-doped Group-III nitride gate layer. The nitride semiconductor device further includes a source electrode and a drain electrode spaced apart from the source electrode.

According to one or more embodiments a high electron mobility transistor (HEMT) is provided which includes a substrate, a buffer layer on the substrate and a channel layer on the substrate. A first barrier layer is arranged on and in contact with the channel layer. The first barrier layer has a bandgap higher than the bandgap of the channel layer to confine a two dimensional electron gas (2-DEG) at a heterojunction between the channel layer and the first barrier layer. A p-doped gate layer section is arranged on and in contact with the first barrier layer in a gate region of the HEMT. An ohmic gate contact is arranged on the p-doped gate layer section to contact electrically the p-doped gate layer section. A source contact is arranged in a source region of the HEMT to contact electrically the 2-DEG layer. A drain contact is arranged in a drain region of the HEMT to contact electrically the 2-DEG layer, wherein the drain region is spaced apart from the source region such that the p-doped gate layer section is arranged between the source contact and the drain contact. A second barrier layer is arranged on and in contact with the first barrier layer.

According to one or more embodiments, the HEMT further includes a substrate and a buffer layer between the substrate and the Group-III nitride layer.

With reference to FIGS. 2A to 2E a first embodiment of a manufacturing method will be described. This embodiment includes a non-selective epitaxial deposition of first and second barrier layers and a selective etching of a gate layer relative to the first barrier layer.

A substrate 1 is provided, which includes an optional buffer layer 2 and gate channel layer 3 as described above. Typically, the semiconductor substrate 1 can be a single bulk mono-crystalline material. Buffer layer 2 and channel layer 3 are typically formed by epitaxial deposition. In this embodiment, the substrate 1 is a Si wafer, the buffer layer 2 is made of AlN, and the channel layer 3 is made of GaN, for example. A multilayer buffer layer 2 can also be used. Next, a thin first barrier layer 41, made of for example AlGaN or MN, is epitaxially deposited on the channel layer 3. First barrier layer 41 may have a thickness in the range of a few nm such as between 1 nm and 20 nm, particularly, between 1 nm and 10 nm, and more particularly between 1 nm and 2 nm, depending on its Al-content. In a further process, an in situ p-doped gate layer 5-1 is deposited, typically by epitaxy. The p-doped gate layer 5-1 can have a thickness of about 100 nm although other thicknesses in a range, for example, 50 nm to 200 nm, are also possible.

According to one or more embodiments, the Al-content of the first barrier layer 41 can be in a range from about 18% to about 25% with the Al-content of the second barrier layer 42 being higher than the Al-content of the first barrier layer 41. As it becomes apparent from the relation illustrated in FIG. 5, it is desirable to have a little Al-content in the first barrier layer 41 in order to avoid a significant shift of the threshold voltage to negative voltages. On the other hand, the Al-content of the first barrier layer 41 should be high enough to allow a selective etching of the gate layer 5-1 relative to the first barrier layer 41 as described below. When the first barrier layer 41 includes a very high Al-content, the thickness of the first barrier layer 41 should be reduced accordingly to keep the threshold shift caused by the first barrier layer 41 in the range from about 0V to −1V.

The p-doped gate layer 5-1 is used to form the p-doped gate layer section 5 and hence is made of the above described material for the p-doped gate layer section 5. Typically, the gate layer 5-1 is highly doped in situ with Mg although other dopants can also be used.

Figure 2A:
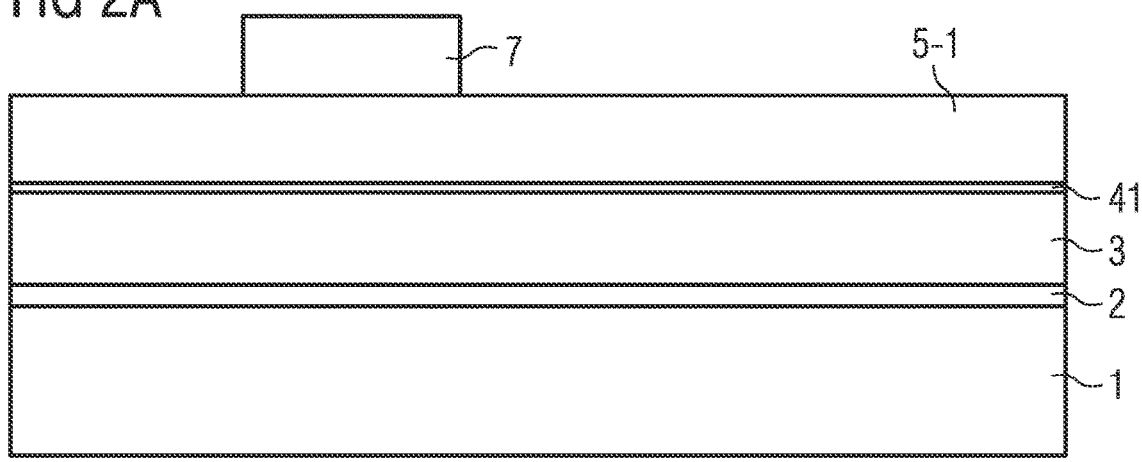
FIGS. 2A to 2E illustrate processes of a method for manufacturing a nitride semiconductor device such as a HEMT according to an embodiment.

A mask 7 is formed on the p-doped gate layer 5-1 in a gate region of the device, i.e. in a range where the p-doped gate layer section 5 is to be formed. The material of the mask 7 is not restricted and can include material for forming a hard mask such as $SiO_2$ or organic or polymeric material. The resulting structure is illustrated in FIG. 2A.

Figure 2B:
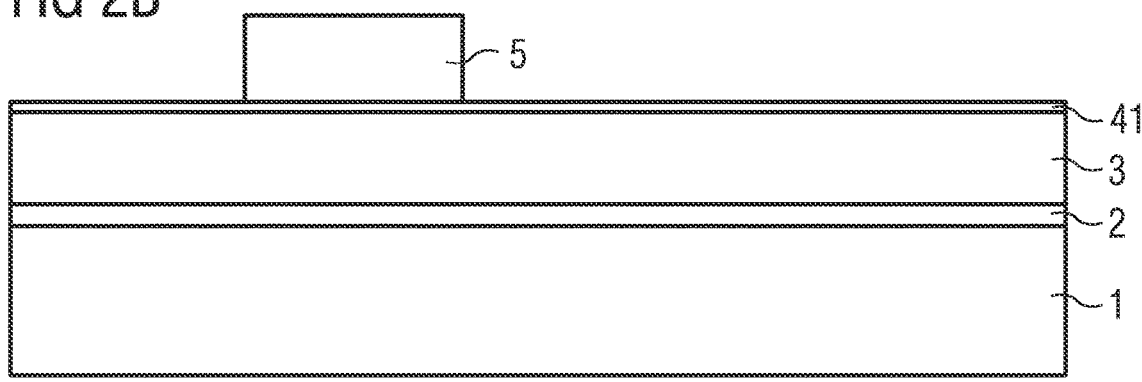

In a subsequent process, the p-doped gate layer 5-1 is etched selectively to the mask 7 and also to the material of the first barrier layer 41. On top of the gate layer 5, a not illustrated highly p-doped capping layer can by formed for providing a good ohmic contact to a later formed gate contact. The first barrier layer 41 can therefore function as an etch stop layer. For enabling selective etching, the Al-content of the first barrier layer 41 can be adjusted selectively to the Al-content of the p-doped gate layer 5-1. For example, the Al-content of the first barrier layer 41 can be higher than the Al-content of the p-doped gate layer 5-1. This results in a desired different etching behaviour. As an example, the Al-content of the first barrier layer 41 can be in a range of about 10% to about 30% while the p-doped gate layer 5-1 does not include Al. The etching process can be a plasma etching using $SF_6$ as etchant. The resulting structure is illustrated in FIG. 2B.

Figure 2C:
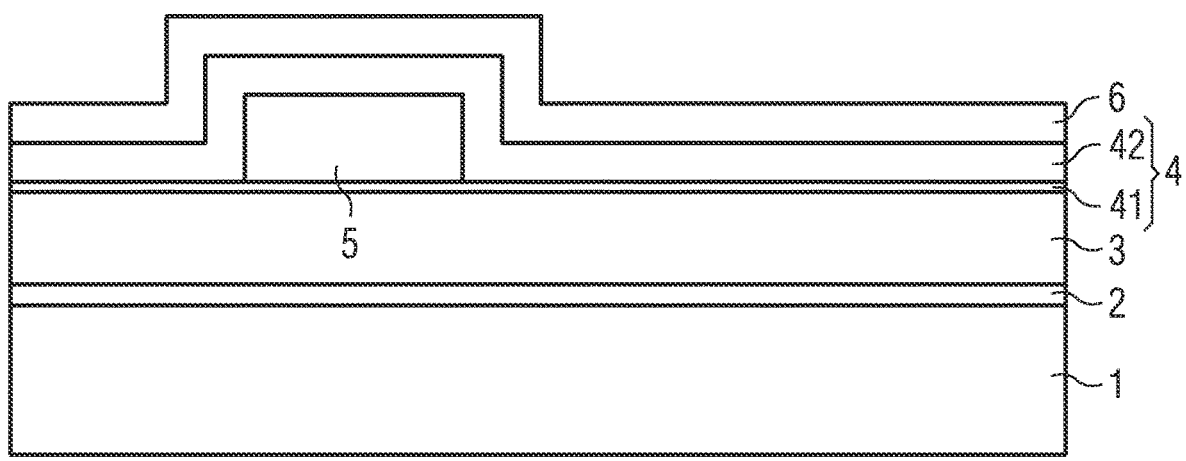
Figure 2D:
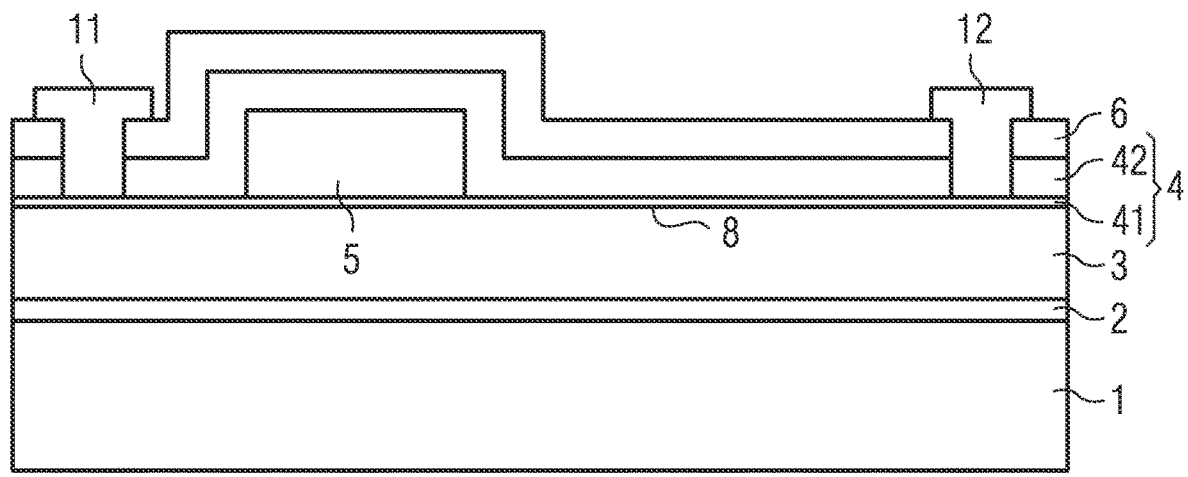

FIG. 2C illustrates further processes, which include deposition of a second barrier layer 42 on exposed portions of the first barrier layer 41 and, in this embodiment, also on the gate layer section 5. The portions of second barrier layer 42, which are arranged on the gate layer section 5, do not serve as barrier layer and are therefore not considered as a portion of the barrier layer 4. Hence, the barrier layer 4 includes a first portion 4-1 having a small thickness defined by first barrier layer 41 only a and second portion 4-2 defined by the combination of first and second barrier layers 41, 42. The second barrier layer 42 is deposited by epitaxy to a thickness of about 5 nm to 50 nm, for example 20 nm. The material of the second barrier layer 42 can be the same as that of the first barrier layer 41 or can be different thereto. For example, AlGaN or AlInN with a suitable Al content can be used.

In a further process, a passivation layer 6 is deposited, which can be done in situ or ex situ. The resulting structure is illustrated in FIG. 2C.

In further a process, contact openings to allow formation of source and drain electrodes are etched in the passivation layer 6 and barrier layer 4. The formed openings can extend completely though the barrier layer 4, i.e. through the first and second barrier layers 41, 42. It is also possible that the openings only extend up to the first barrier layer 41. In a further process, contact metal is deposited to form the source and drain electrodes 11, 12. Then, a furnace anneal is carried out which causes formation of metallurgical phases to improve the electrical contact to the 2-DEG layer 8. The formed metallurgical phases also extend through the first barrier layer 41 under the source and drain electrodes 11, 12 even when the etched openings stop at the first barrier layer 41 so that a desired electrical contact to the 2-DEG layer 8 formed at the interface between the channel layer 3 and the first barrier layer 41 is reliably formed.

Figure 2E:
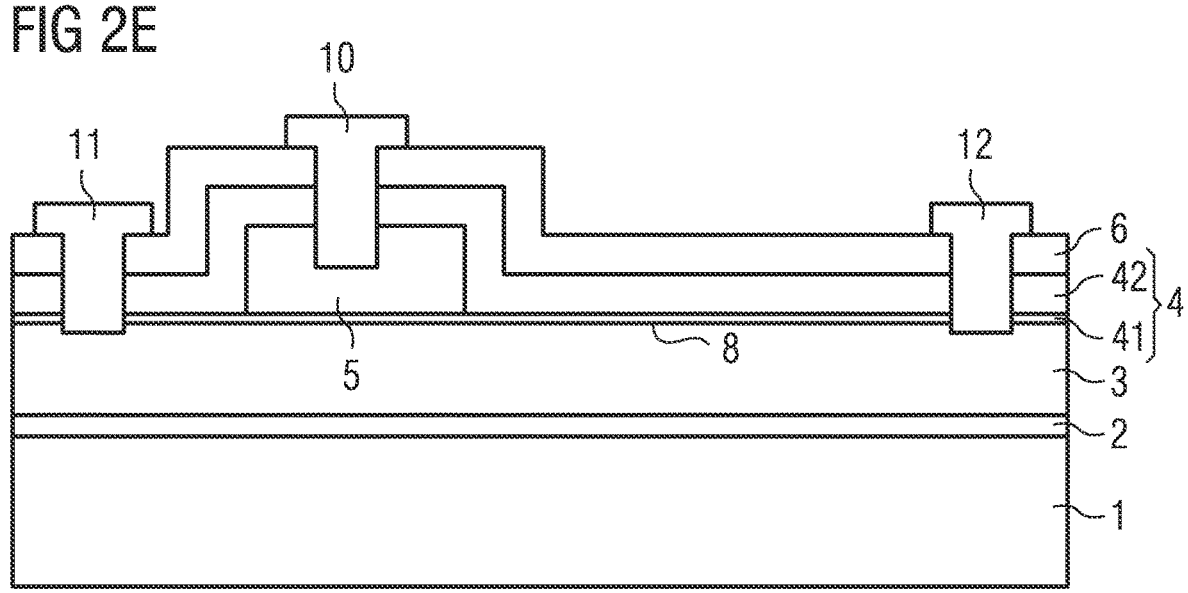

In a further process, a gate contact 10 is formed by etching an opening through the passivation layer 6 and second barrier layer 42 and depositing a conductive material to provide an electrical connection to the gate layer section 5. In the present embodiment, each of the contacts 10 and electrodes 11, 12 are ohmic contacts. The material of the contact 10 and electrodes 11, 12 can be selected according to specific needs. It is also possible to form the source and drain electrodes 11, 12 and the gate contact 10 in a common process. The resulting structure is illustrated in FIG. 2E, which corresponds to FIG. 1.

With reference to FIGS. 3A to 3E, a further embodiment for manufacturing a nitride semiconductor device will be described. This embodiment includes a selective epitaxial deposition of a second barrier layer on exposed portions of a first barrier layer and a selective etching of a p-doped gate layer relative to the second barrier layer.

Different to the first embodiment, the buffer layer 2 is omitted since substrate 1 is made of a semiconductor material having a lattice structure similar to the lattice structure of the channel layer 3. If desired, a buffer layer can also be included. The first barrier layer 41 is formed on the channel layer 3 as described above.

Figure 3A:
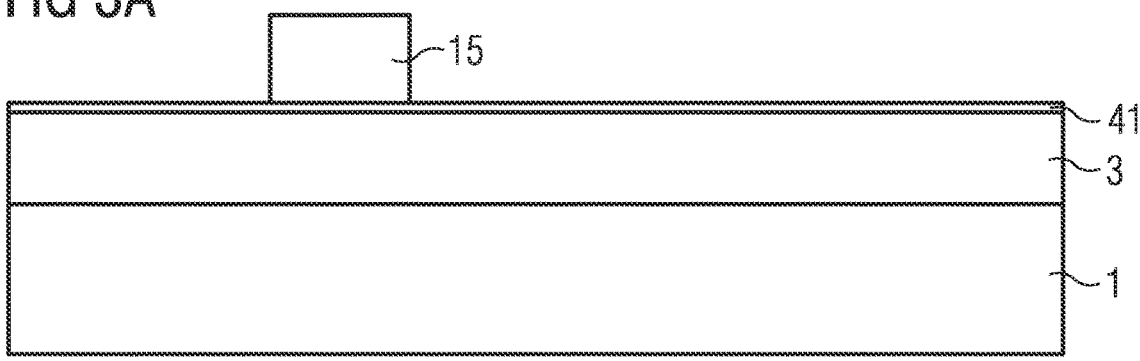
FIGS. 3A to 3E illustrate processes of a method for manufacturing a nitride semiconductor device such as a HEMT according to an embodiment.

A mask or sacrificial layer 15 is formed on the first barrier layer 41. The mask 15 can be, for example, a hard mask made of an oxide such as $SiO_2$ and formed by depositing an about 100 nm thick oxide layer, which is subsequently patterned. Mask 15 defines the region where the gate layer section is later formed, i.e. the gate region. The resulting structure is illustrated in FIG. 3A.

Figure 3B:
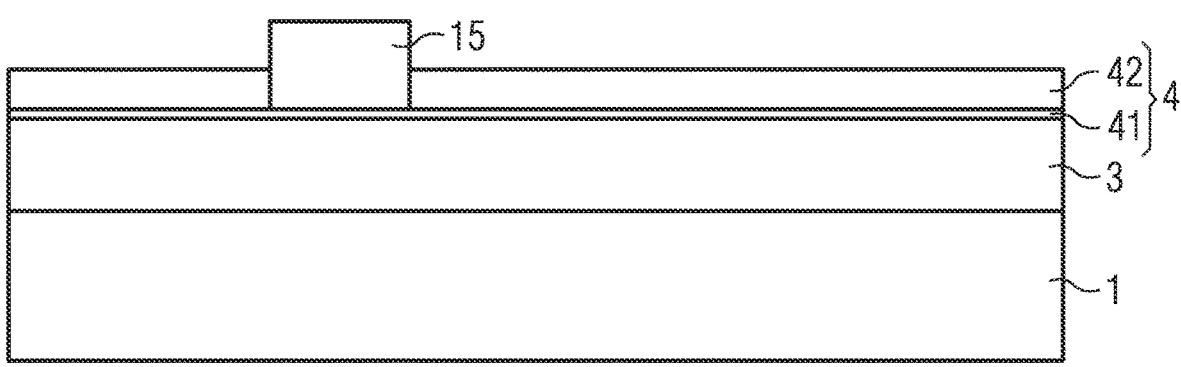

A second barrier layer 42 is formed on the first barrier layer 41 by selective epitaxial growth of AlGaN or InAlN to a thickness of about 20 nm. No semiconductor material is deposited on the mask 15 as illustrated in FIG. 3B.

Figure 3C:
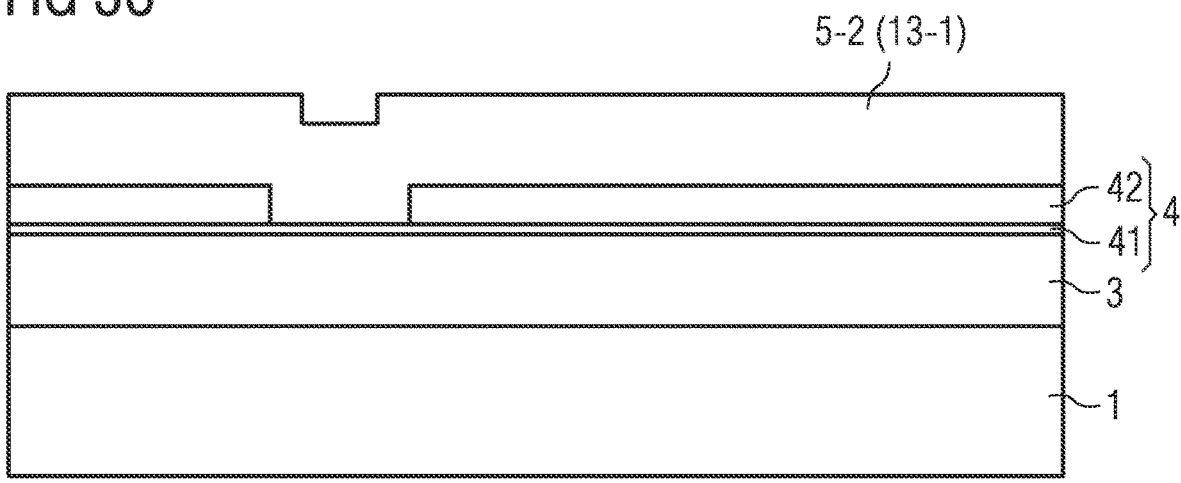

In a subsequent process, as illustrated in FIG. 3C, hard mask 15 is removed by a wet oxide etch so that an opening in the second barrier layer 42 is formed for exposing the first barrier layer 41. First and second barrier layers 41, 42 form together the barrier layer 4, which has a recess formed by the opening in the second barrier layer 42.

In a further process, as illustrated in FIG. 3C, an in situ p-doped gate layer 5-2 is deposited, using a material and process as described above. The p-doped gate layer 5-2 also lines and fills the opening of the second barrier layer 42 (recess in the barrier layer 4) so that the p-doped gate layer 5-2 is also formed on and in contact with the first barrier layer 41 in the gate region defined by the opening.

Figure 3D:
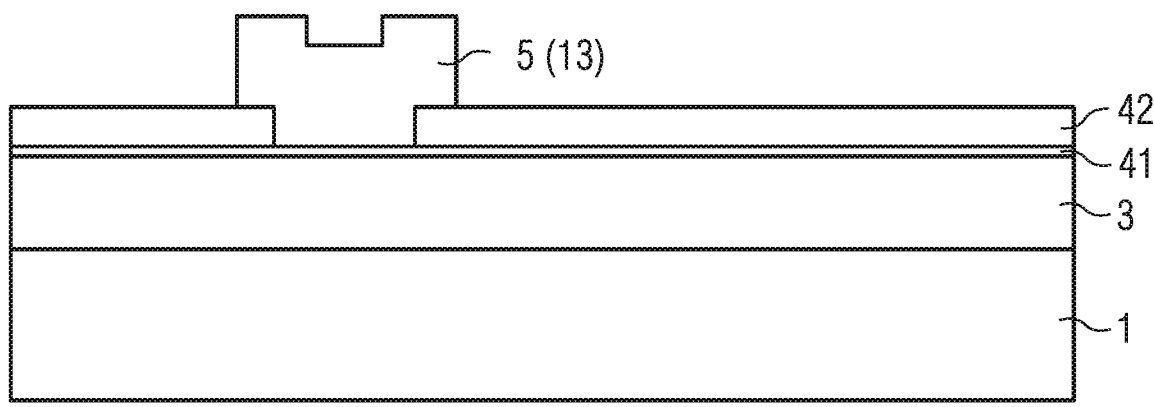

As illustrated in FIG. 3D, p-doped gate layer 5-2 is etched using a lithographically formed mask (not illustrated). The etching, typically a plasma etching using $SF_6$, is selective to the material of the second barrier layer 42 so that the etching stops at the second barrier layer 42. As described above in connection with the embodiment illustrated in FIGS. 2A to 2E, the etch selectivity can be adjusted by selecting the Al-content of the second barrier layer 42 forming the etch stop layer. Typically, the Al-content is in the range of about 18% to about 25% which results in a sufficient etch selectivity to p-doped GaN, which can be used as material of the p-doped gate layer 5-2. A higher Al-content even further improves the etch selectivity and also improves the channel characteristics in the gate-drain and gate-source section of the 2-DEG layer 8 without affecting the threshold voltage of the HEMT 100. Since second barrier layer 42 is formed outside of the gate region, it can have a high Al-content.

The resulting structure is illustrated in FIG. 3D. The thus formed p-doped gate layer section 5 partially covers the second barrier layer 42 since the lithographic mask has been formed larger than the opening to prevent removal of the p-doped gate layer 5-2 in case of a misalignment of the lithographic mask.

Figure 3E:
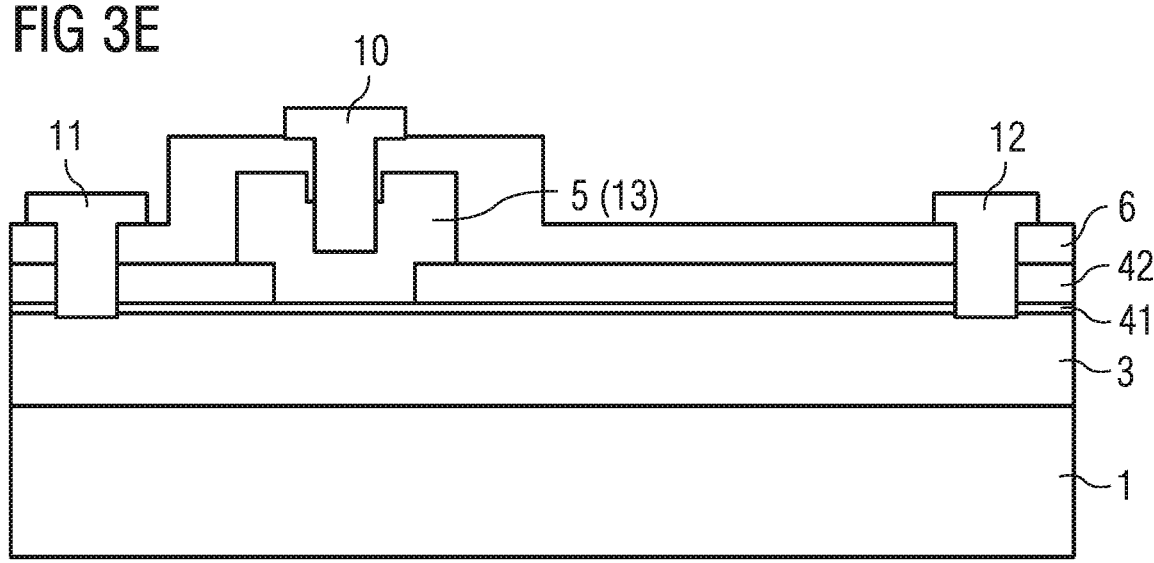

In further processes, as illustrated in FIG. 3E, a passivation layer 6 is deposited, and gate contact 10 and source and drain electrodes 11 and 12 are formed, for example as described above.

In this embodiment, the same material can be used for the first and second barrier layers 41, 42. It is, however, also possible to use different materials, particularly materials having a different Al-content, if desired.

The embodiments illustrated in FIGS. 2A to 2E and 3A to 3D allow a very precise adjustment of the thickness of the first portion 4-1 of the barrier layer 4 between the gate layer section 5 and the channel layer 3 since the thickness in that region is controlled by the epitaxial deposition process used to form the first barrier layer 41. Another improvement is that the Al-content of the first barrier layer 41 can also be lower than the Al-content of the second barrier layer 42 to keep the threshold voltage of the HEMT 100 in a region of about +2V to about +3V without affecting the conductivity of the 2-DEG layer 8 in the gate-drain and gate-source section, respectively. The Furthermore, the embodiments illustrated in FIGS. 2A to 2E and 3A to 3D refer to the double barrier layer HEMT as described above.

With reference to FIGS. 4A to 4E, a further embodiment for manufacturing a nitride semiconductor device will be described. This embodiment includes a partial etching of a barrier layer and a selective epitaxial deposition of a p-doped gate layer on exposed portions of the barrier layer. Furthermore, this embodiment uses a single barrier layer. Instead of a single barrier layer, a double layer structure as described above can also be used. For example, the barrier layers of different AL-content can be used to allow selective etching.

The process starts with a channel layer 3, which can be arranged on a not illustrated substrate and an optional buffer layer, on which a barrier layer 4 is formed. In this embodiment, barrier layer 4 is formed by a single layer. It is also possible, to include different barrier layers which form together the barrier layer 4. For example, several monolayers of the same or different material can be used. Using different materials allows, for example, formation of a barrier layer having grading in the Al-content. In this embodiment, barrier layer 4 can be, for example, an epitaxially grown AlGaN or an AlInN layer having a thickness of about 20 nm, but can also be made of any of the materials described above. Channel layer 3 can be made of, for example, GaN, but can also be made of any of the materials described above.

A cover layer 17, which later also constitutes a passivation layer, is deposited on the barrier layer 4. Cover layer 17 can be, for example, a hardmask made of $SiO_2$ or $Si_3N_4$.

Figure 4A:
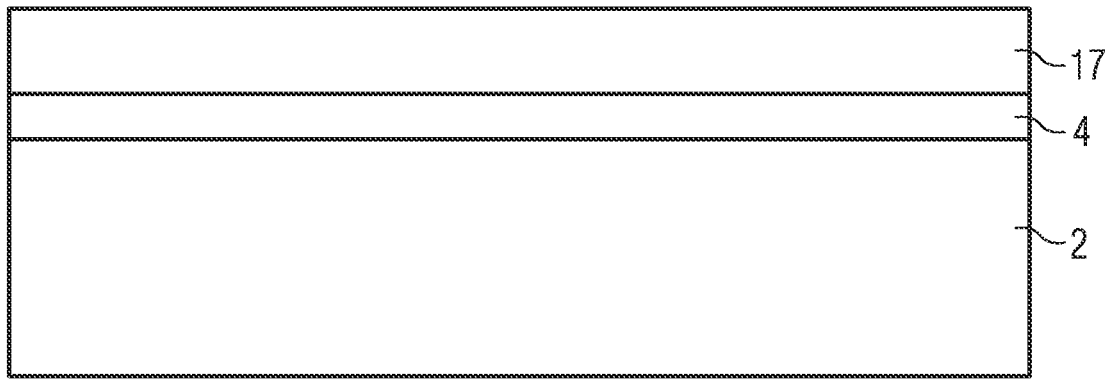
Figure 4B:
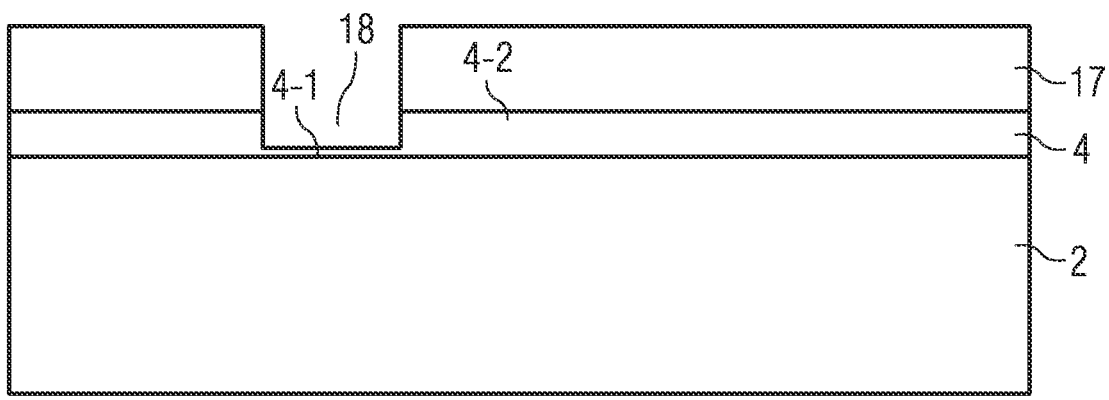

As illustrated in FIG. 4B, the cover layer 17 is patterned using a not illustrated lithographic mask to form an opening in the cover layer 17, which opening defines the gate region of the device. In a further process, the barrier layer is partially etched, for example by plasma-assisted $SF_6$ etching, using the patterned cover layer 17 as etch mask to form a recess 18 in the barrier layer 4. The etch time controls the extent to which the barrier layer 4 is formed and is selected such that the barrier layer 4 is not completely removed, i.e. a thin portion of the barrier layer 4 remains. In one embodiment, if barrier layer 4 includes a first and a second barrier layer of different materials as described above, it is also possible to etch the second barrier layer selectively to the first barrier layer, which functions then as etch stop layer. The resulting structure is illustrated in FIG. 4B showing a thin first portion 4-1 (recess 18) of the barrier layer 4 in the gate region and a thick second portion 4-2 outside the gate region.

Figure 4C:
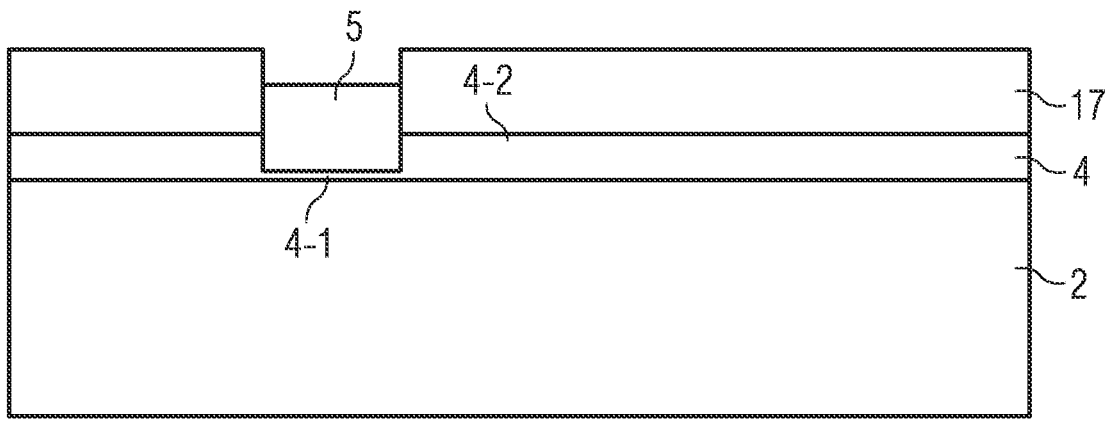

As illustrated in FIG. 4C, an in situ p-doped gate layer section 5 is deposited by selective epitaxial deposition on exposed portion of the barrier layer 4, i.e. the exposed first portion 4-1. The deposition can be controlled such that no lateral overgrowth occurs. Gate layer section 5 can have a larger thickness than the barrier layer 4 and can be recessed from the upper surface of the cover layer 17. In this embodiment, p-doped gate layer section 5 is made of GaN but can also be made of any of the materials described above.

In a further process, a selective epitaxial deposition of further material of the p-doped gate layer section 5 is performed which also results in a partial lateral overgrowth of the gate layer section 5 over the cover layer 17, as illustrated in FIG. 4D.

As illustrated in FIG. 4E, a gate contact 10 is formed on the p-doped gate layer section 5 and source and drain electrodes 11, 12 are formed as described above.

According to another embodiment, a method for manufacturing a nitride semiconductor device is provided. The method includes providing a Group-III nitride channel layer; forming a Group-III nitride barrier layer having a recess on the Group-III nitride channel layer, the Group-III nitride barrier layer; forming a p-doped Group-III nitride gate layer section at least in the recess of the Group-III nitride barrier layer; forming a gate contact on the p-doped Group-III nitride gate layer; forming a source electrode; forming a drain electrode spaced apart from the source electrode.

A skilled person will appreciate that processes from the above embodiments can be combined and exchanged to obtain further embodiments. Particularly, the functional layers can include material different to the specific material described in connection with the above embodiments as long as the desired functional characteristics remain substantially the same or are equivalent thereto.

Figure 6:
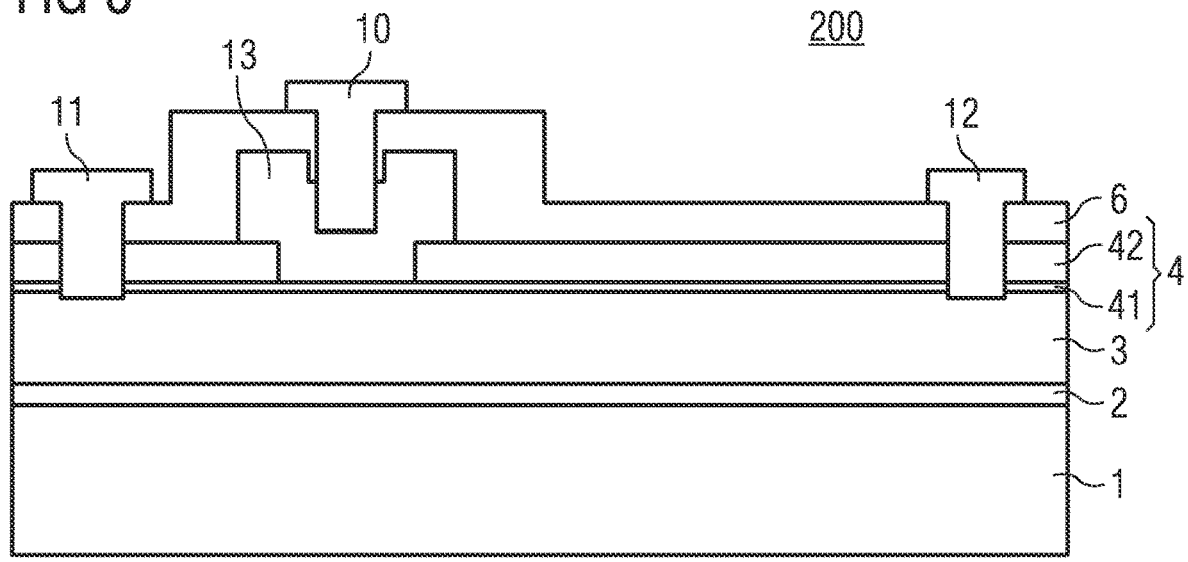
FIG. 6 illustrates a nitride semiconductor device embodied as a HEMT according to an embodiment.

FIG. 6 illustrates a further embodiment pertaining to a nitride semiconductor device. The device 200, which can be a HEMT, can have substantially the same structure as the device 100 of FIG. 1 with the difference that the p-doped gate layer section is replaced by a metal 13 forming a Schottky contact on the first barrier layer 41. Depending on the thickness of the first barrier layer 41, the device can be an enhancement mode or a depletion mode device. The double barrier layer approach can therefore also be applied to depletion mode devices to allow a precise thickness control of the barrier layer 4 to form a recessed gate structure. The manufacturing methods as illustrated above can be easily adapted by replacing the p-doped gate layer 5-1 and p-doped gate layer section 5 with a metal for forming a Schottky contact.

The processes illustrated in FIGS. 3A to 3E are for example suitable to form such HEMT. The processes of FIGS. 3A and 3B are for example used to form first and second barrier layer 41, 42. Different to the processes illustrated in FIGS. 3C and 3D, a Schottky metal layer 13-1 is deposited and pattern to form a Schottky contact 13. The remaining process as illustrated in FIG. 3C can be used to finish the HEMT.

This modification allows any easy integration of depletion and enhancement devices into a single substrate to form complementary integrated circuits on the basis of Group-III nitride semiconductor material. Since similar processes can be used to form the depletion and the enhancement devices, the integration requires only few additional steps. This opens up the possibility of designing Group-III nitride logical devices, which can operate at high speed and low power consumption. Furthermore, complementary power devices or power devices with integrated logic can be formed.

Accordingly, a nitride semiconductor device such as a HEMT is provided. The nitride semiconductor device includes a Group-III nitride channel layer; at least a first Group-III nitride barrier layer on the Group-III nitride channel layer; at least a second Group-III nitride barrier on the first Group-III nitride barrier layer, the second barrier layer including an opening extending to the first barrier layer; a Schottky metal section at least in the opening and in contact with the first Group-III nitride barrier layer; a 2-DEG layer at the junction between the Group-III nitride channel layer and the first Group-III nitride barrier layer; a gate contact on the Schottky metal section; a source electrode in electrical contact with 2-DEG layer; and a drain electrode in electrical contact with the 2-DEG layer and spaced apart from the source electrode.

Accordingly, a nitride semiconductor device such as a HEMT is provided. The nitride semiconductor device includes a Group-III nitride channel layer; at least a first Group-III nitride barrier layer on the Group-III nitride channel layer; at least a second Group-III nitride barrier on the first Group-III nitride barrier layer, the second barrier layer including an opening extending to the first barrier layer; a gate layer section at least in the opening and in contact with the first Group-III nitride barrier layer; a 2-DEG layer at the junction between the Group-III nitride channel layer and the first Group-III nitride barrier layer; a gate contact on the gate layer section; a source electrode in electrical contact with 2-DEG layer; and a drain electrode in electrical contact with the 2-DEG layer and spaced apart from the source electrode. Gate layer section can be a Schottky metal or p-doped Group-III nitride material.

The common processing of depletion mode and enhancement mode devices is illustrated in FIGS. 7A to 7C. The manufacturing of the device 300 including an enhancement mode device 100 and a depletion mode device 400 is based on the processes of FIGS. 3A to 3E. After selective deposition of the second barrier layer 42 in the region of both devices 100, 400, first the p-doped gate layer section 5 is formed in the region of the enhancement mode device 100 (FIG. 7A) and then the Schottky contact 13 is formed in the region of the depletion mode device 400. Subsequently, passivation layer 6, gate contacts 100 and source and drain electrodes 11, 12, respectively, are formed in the region of both devices. The final structure is illustrated in FIG. 7C. It would also be possible to use a manufacturing method based on the FIGS. 4A to 4E, for example.

A further variation is illustrated in FIG. 7D. The second barrier layer 41 in the region of the depletion mode device 500 does not include an opening so that the barrier layer 4 has the same thickness in the first portion 4-1 and the second portion 4-2.

Another option is to form an additional gate dielectric layer on the recessed portion (first portion) of the barrier layer below the p-doped gate layer section. This also results in the formation of an enhancement mode device. Accordingly, such enhancement mode devices can be integrated together with the enhancement mode devices described above.

According to one or more embodiments, a nitride semiconductor circuit is provided which includes at least one depletion mode device and at least one enhancement mode device as described above. Both devices can include a double barrier layer as described above.

The written description above includes specific embodiments, including the best mode, and also to enable any person skilled in the art to make and use the invention. While the invention has been described in terms of various specific embodiments, those skilled in the art will recognise that the invention can be practiced with modifications within the spirit and scope of the claims. Especially, mutually non-exclusive features of the embodiments described above may be combined with each other. The patentable scope is defined by the claims, and may include other examples that occur to those skilled in the art. Such other examples are intended to be within the scope of the claims.

What is claimed is:

1. A semiconductor device, comprising:
    an undoped channel layer comprised of $Al_aGa_{1-a}N$ with $0 \le a \le 1$;
    an undoped barrier layer comprising:
        an undoped first barrier layer being one of $Al_{b1}Ga_{1-b1}N$ ($0 \le b1 \le 1$ and $a<b1$) and $Al_{c1}In_{1-c1}N$ ($0 \le c1 \le 1$ and $a<c1$), the undoped first barrier layer disposed on and in contact with the undoped channel layer, the undoped first barrier layer having a bandgap higher than that of the undoped channel layer and forming a heterojunction with the undoped channel layer, and
        an undoped second barrier layer being one of $Al_{b2}Ga_{1-b2}N$ ($0 \le b2 \le 1$; $a<b2$) and $Al_{c2}In_{1-c2}N$ ($0 \le c2 \le 1$; $a<c2$), the undoped second barrier layer having a first surface and a second surface on a side opposite the first surface, and disposed on and in contact with the undoped first barrier layer at the first surface, wherein the undoped second barrier layer includes an opening extending there through to define a recess in the undoped second barrier layer that exposes the undoped first barrier layer, wherein $b1<b2$ and $c1<c2$;
    a p-doped gate layer comprising $Al_zGa_{1-z}N$ with $0 \le z \le 1$ disposed at least within the recess so as to be on and in contact with the undoped first barrier layer exposed within the recess, and wherein the p-doped gate layer partially covers the second surface of the undoped second barrier layer; and
    a metal gate contact disposed within an opening in the p-doped gate layer and separated from the undoped channel layer by only the p-doped gate layer and the undoped first barrier layer.

2. The device of claim 1, wherein the undoped first barrier layer has a thickness different to a thickness of the undoped second barrier layer.

3. The semiconductor device of claim 1, wherein a thickness of the undoped first barrier layer is less than a thickness of the undoped second barrier layer.

4. The semiconductor device of claim 1, further comprising:
    a passivation layer over the undoped second barrier layer and the p-doped gate layer.

5. The semiconductor device of claim 1, further comprising:
    a source electrode in contact with the undoped channel layer; and
    a drain electrode in contact with the undoped channel layer.

6. The semiconductor device of claim 1, further comprising:
    a substrate comprising a semiconductor material,
    wherein the undoped channel layer is in contact with the substrate.

7. The semiconductor device of claim 1, wherein the semiconductor device comprises a high electron mobility transistor.

8. A semiconductor device, comprising:
    an undoped Group-III nitride channel layer;
    an undoped Group-III nitride barrier layer disposed on the Group-III nitride channel layer, the undoped Group-III nitride barrier layer comprising:
        an undoped first Group-III nitride barrier layer disposed on and in contact with the undoped Group-III nitride channel layer, and
        an undoped second Group-III nitride barrier layer arranged on and in contact with the undoped first Group-III nitride barrier layer, the undoped second Group-III nitride barrier layer having a first surface and a second surface on a side opposite the first surface, and wherein the undoped second Group-III nitride barrier layer includes an opening extending there through to the undoped first Group-III nitride barrier layer which defines a recess in the undoped second Group-III nitride barrier layer that exposes the undoped first Group-III nitride barrier layer at the first surface, wherein a first Al-content of the undoped first Group-III nitride barrier layer is lower than a second Al-content of the undoped second Group-III nitride barrier layer;
    a p-doped Group-III nitride gate layer section disposed within the recess so as to be on and in contact with the undoped first Group-III nitride barrier layer exposed within the recess, and wherein the p-doped Group-III nitride gate layer partially covers the second surface of the undoped second Group-III nitride barrier layer; and a metal gate contact disposed within an opening in the p-doped Group-III nitride gate layer section and separated from the undoped Group-III nitride channel layer by only the p-doped Group-III nitride gate layer section and the undoped first Group-III nitride barrier layer.

9. The device of claim 8, wherein the undoped first Group-III nitride barrier layer comprises the first Al-content different to an Al-content of the p-doped Group-III nitride gate layer section.

10. The semiconductor device of claim 8, wherein a thickness of the undoped first Group-III nitride barrier layer is less than a thickness of the undoped second Group-III nitride barrier layer.

11. The semiconductor device of claim 8, further comprising:
a passivation layer over the undoped second Group-III nitride barrier layer and the p-doped Group-III nitride gate layer section.

12. The semiconductor device of claim 8, further comprising:
a source electrode in contact with the undoped Group-III nitride channel layer; and
a drain electrode in contact with the undoped Group-III nitride channel layer.

13. The semiconductor device of claim 7, further comprising:
a substrate comprising a semiconductor material,
wherein the undoped Group-III nitride channel layer is in contact with the substrate.

14. The semiconductor device of claim 8, wherein the semiconductor device comprises a high electron mobility transistor.

15. A method for manufacturing a semiconductor device, the method comprising:
forming an undoped channel layer comprised of $Al_aGa_{1-a}N$ with $0 \le a \le 1$;
forming an undoped barrier layer comprising:
an undoped first barrier layer being one of $Al_{b1}Ga_{1-b1}N$ ($0 \le b1 \le 1$ and $a<b1$) and $Al_{c1}In_{1-c1}N$ ($0 \le c1 \le 1$ and $a<c1$), the undoped first barrier layer disposed on and in contact with the undoped channel layer, the undoped first barrier layer having a bandgap higher than that of the undoped channel layer and forming a heterojunction with the undoped channel layer, and
an undoped second barrier layer being one of $Al_{b2}Ga_{1-b2}N$ ($0 \le b2 \le 1$; $a<b2$) and $Al_{c2}In_{1-c2}N$ ($0 \le c2 \le 1$; $a<c2$), the undoped second barrier layer having a first surface and a second surface on a side opposite the first surface, and disposed on and in contact with the undoped first barrier layer at the first surface, wherein the undoped second barrier layer includes an opening extending there through to define a recess in the undoped second barrier layer that exposes the undoped first barrier layer, wherein $b1<b2$ and $c1<c2$;
forming a p-doped gate layer comprising $Al_zGa_{1-z}N$ with $0 \le z \le 1$ disposed at least within the recess so as to be on and in contact with the undoped first barrier layer exposed within the recess, and wherein the p-doped gate layer partially covers the second surface of the undoped second barrier layer; and
forming a metal gate contact disposed within an opening in the p-doped gate layer and separated from the undoped channel layer by only the p-doped gate layer and the undoped first barrier layer.

16. The method of claim 15, wherein the undoped first barrier layer has a thickness different to a thickness of the undoped second barrier layer.

17. The method of claim 15, wherein a thickness of the undoped first barrier layer is less than a thickness of the undoped second barrier layer.

18. The method of claim 15, further comprising:
forming a passivation layer over the undoped second barrier layer and the p-doped gate layer.

19. The method of claim 15, further comprising:
forming a source electrode in contact with the undoped channel layer; and
forming a drain electrode in contact with the undoped channel layer.

20. The method of claim 15, further comprising:
forming the undoped channel layer in contact with a substrate.

* * * * *

UNITED STATES PATENT AND TRADEMARK OFFICE
CERTIFICATE OF CORRECTION

PATENT NO. : 11,004,966 B2
APPLICATION NO. : 14/708736
DATED : May 11, 2021
INVENTOR(S) : Haeberlen et al.

Page 1 of 1

It is certified that error appears in the above-identified patent and that said Letters Patent is hereby corrected as shown below:

In the Claims

Column 15, Line 25, Claim 13 delete "claim 7" and insert in place thereof --claim 8--.

Signed and Sealed this
Thirteenth Day of July, 2021

Drew Hirshfeld
*Performing the Functions and Duties of the
Under Secretary of Commerce for Intellectual Property and
Director of the United States Patent and Trademark Office*